United States Patent
Cho

(10) Patent No.: US 10,018,866 B2
(45) Date of Patent: Jul. 10, 2018

(54) OUTDOOR DISPLAY APPARATUS

(71) Applicant: SAMSUNG ELECTRONICS CO., LTD., Suwon-si, Gyeonggi-do (KR)

(72) Inventor: Jin Hyun Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 54 days.

(21) Appl. No.: 14/727,166

(22) Filed: Jun. 1, 2015

(65) Prior Publication Data

US 2015/0261037 A1 Sep. 17, 2015

Related U.S. Application Data

(63) Continuation of application No. 13/361,020, filed on Jan. 30, 2012, now Pat. No. 9,075,262.

(30) Foreign Application Priority Data

Feb. 1, 2011 (KR) .................. 10-2011-0010313

(51) Int. Cl.
*G02F 1/1333* (2006.01)
*G02F 1/13363* (2006.01)
(Continued)

(52) U.S. Cl.
CPC .... *G02F 1/133385* (2013.01); *G02F 1/13363* (2013.01); *G02F 1/133308* (2013.01);
(Continued)

(58) Field of Classification Search
CPC ......... G02F 1/133385; G02F 1/133308; G02F 1/133528; G02F 1/13363; G02F 1/133502;
(Continued)

(56) References Cited

U.S. PATENT DOCUMENTS 6,392,727 B1 * 5/2002 Larson ............... G02F 1/133502
349/117
2002/0018163 A1 2/2002 Yamamoto et al.
(Continued)

FOREIGN PATENT DOCUMENTS

CN 101221300 7/2008
CN 101400244 4/2009
(Continued)

OTHER PUBLICATIONS

Machine translation of JP 2009069548; Downloaded from WIPO at https://patentscope.wipo.int/search/en/result.jsf on Apr. 24, 2017; translation provided on site.*
(Continued)

*Primary Examiner* — Angela Davison
(74) *Attorney, Agent, or Firm* — Staas & Halsey LLP

(57) ABSTRACT

An outdoor display apparatus includes a housing having an opening, an inlet port and an outlet port, a transparent member disposed in tile opening, a liquid crystal display panel module disposed in the housing so that the liquid crystal display panel module is spaced from the transparent member to define a gap therebetween, the liquid crystal display panel module being provided at a front thereof with a liquid crystal display panel, a circuit disposed at a rear of the liquid crystal display panel module, an optical film disposed inside the transparent member at a position corresponding to the liquid crystal display panel, and an air circulation device to distribute air introduced through the inlet port so that the distributed air passes through the gap between the transparent member and the liquid crystal display panel and through the circuit and is discharged through the outlet port.

23 Claims, 3 Drawing Sheets

(51) Int. Cl.
   *H05K 7/20*     (2006.01)
   *G02F 1/1335*   (2006.01)
(52) U.S. Cl.
   CPC ... *G02F 1/133528* (2013.01); *H05K 7/20972* (2013.01); *G02F 1/133502* (2013.01); *G02F 2001/133331* (2013.01); *G02F 2001/133531* (2013.01); *G02F 2001/133541* (2013.01); *G02F 2001/133562* (2013.01); *G02F 2001/133638* (2013.01); *G02F 2202/22* (2013.01)
(58) Field of Classification Search
   CPC ........ G02F 2001/133331; G02F 2001/133531; G02F 2001/133541; G02F 2001/133562; G02F 2001/133638; G02F 2202/22; H05K 7/20972
   USPC .......................................................... 349/58
   See application file for complete search history.

(56) References Cited

U.S. PATENT DOCUMENTS

| | | | |
|---|---|---|---|
| 2007/0040816 A1* | 2/2007 | Toyomaki | G02F 1/13338 345/174 |
| 2007/0103866 A1* | 5/2007 | Park | H05K 7/20972 361/695 |
| 2009/0135365 A1 | 5/2009 | Dunn | |
| 2010/0171889 A1* | 7/2010 | Pantel | G02F 1/133308 349/1 |
| 2011/0019363 A1 | 1/2011 | Vahlsing et al. | |

FOREIGN PATENT DOCUMENTS

| | | | |
|---|---|---|---|
| CN | 101587260 | 11/2009 | |
| CN | 101604084 | 12/2009 | |
| CN | 101714320 | 5/2010 | |
| CN | 101946271 | 1/2011 | |
| EP | 2124091 | 11/2009 | |
| JP | 2009069548 | * 9/2010 | ............... G02B 5/30 |
| KR | 1999-0082891 | 11/1999 | |
| KR | 10-2008-0005024 | 1/2008 | |
| KR | 10-2009-0129654 | 12/2009 | |
| WO | 00/41030 | 7/2000 | |

OTHER PUBLICATIONS

Chinese Office Action dated Feb. 10, 2015 from Chinese Patent Application No. 201210020858.5, 11 pages.
European Search Report dated May 31, 2012 in EP Patent Application No. 12152428.4.
U.S. Office Action dated Apr. 8, 2014 from U.S. Appl. No. 13/361,020.
U.S. Office Action dated Oct. 15, 2014 from U.S. Appl. No. 13/361,020.
U.S. Notice of Allowance dated Mar. 2, 2015 from U.S. Appl. No. 13/361,020.
U.S. Appl. No. 13/361,020, filed Jan. 30, 2012, Jin Hyun Cho, Samsung Electronics Co., Ltd.
Korean Notice of Allowance dated Feb. 15, 2017 in corresponding Korean Patent Application No. 10-2011-0010313, 8 pages.

* cited by examiner

OUTDOOR DISPLAY APPARATUS

CROSS-REFERENCE TO RELATED APPLICATIONS

This application is a continuation of U.S. patent application Ser. No. 13/361,020, filed on Jan. 30, 2012, which is currently pending, and claims priority under 35 U.S.C, § 119 from Korean Patent Application No. 10-2011-0010313 filed with the Korean Intellectual Property Office on Feb. 1, 2011, the disclosures of each of which are incorporated herein by reference in their entirety.

BACKGROUND OF THE INVENTION

1. Field of the Invention

Embodiments of the present general inventive concept relate to an outdoor display apparatus.

2. Description of the Related Art

An outdoor display apparatus is an apparatus disposed outside a building to display an image. An example of an outdoor display apparatus includes a signboard.

Generally, an outdoor display apparatus includes a housing, a transparent member disposed at one side of the housing, and a display panel disposed inside the transparent member to display an image. Recently, an outdoor display apparatus using a liquid crystal display panel as a display panel has been used.

SUMMARY OF THE INVENTION

The present general inventive concept provides an outdoor display apparatus that improves visibility of an image displayed on a liquid crystal display panel and prevents the liquid crystal display panel from deteriorating.

Additional aspects and advantages of the present general inventive concept will be set forth in part in the description which follows and, in part, will be obvious from the description, or may be learned by practice of the general inventive concept The foregoing and/or other features and utilities of the present general inventive concept may be achieved by providing an outdoor display apparatus including a housing having an opening formed at a front thereof, an inlet port through which air is introduced inside the housing, and an outlet port through which air is discharged outside the housing, a transparent member disposed in the opening, a liquid crystal display panel module disposed in the housing so that the liquid crystal display panel module is spaced from the transparent member to define a gap therebetween, the liquid crystal display panel module being provided at the front thereof with a liquid crystal display panel to display an image, a circuit disposed at the rear of the liquid crystal display panel module, an optical film disposed inside the transparent member at a position corresponding to the liquid crystal display panel of the liquid crystal display panel module, and an air circulation device to distribute air introduced through the inlet port so that the distributed air passes through the gap between the transparent member and the liquid crystal display panel and through the circuit and is discharged through the outlet port.

The optical film may include a polarizing film having the same optical axis as light passing through the liquid crystal display panel.

The polarizing film may have a surface area equal to or greater than that of an effective display area of the liquid crystal display panel and equal to or less than that of the transparent member.

The optical film may further include a ¼ wavelength plate attached to the polarizing film to convert an optical axis of an image displayed on the liquid crystal display panel into circular polarized light.

The polarizing film and the ¼ wavelength plate may have a surface area equal to or greater than that of an effective display area of the liquid crystal display panel and equal to or less than that of the transparent member.

The outdoor display apparatus may further include an anti-static film disposed at the transparent member and/or the liquid crystal display panel to restrain generation of static electricity.

The outdoor display apparatus may further include an anti-reflection film disposed at the transparent member and/or the liquid crystal display panel to reduce reflection of light.

The air circulation device may be disposed at the lower part of the housing, the inlet port may be provided at the lower part of the housing, and the outlet port may be provided at the upper part of the housing.

The air introduced through the inlet port may be distributed so that some of the air passes through the gap between the transparent member and the liquid crystal display panel and is discharged through the outlet port and so that the remainder of the air passes through the circuit and is discharged through the outlet port.

The liquid crystal display panel module may further include a backlight unit disposed to irradiate light to the liquid crystal display panel, and the circuit may include a drive unit to drive the liquid crystal display panel and the backlight unit, a signal processing unit to receive and display an external signal on the liquid crystal display panel, and a power supply unit to convert and distribute external power to the drive unit and the signal processing unit.

The air circulation device may include a blowing fan, a drive motor to rotate the blowing fan, and a guide duct, in which the blowing fan is disposed, having a first discharge port to guide air discharged from the blowing fan to the gap between the transparent member and the liquid crystal display panel.

The guide duct may be further provided with a second discharge port to guide some of the air discharged from blowing fan to the circuit.

The first discharge port may guide 70% of the air discharged from blowing fan and the second discharge port may guide 30% of the air discharged from blowing fan.

The outdoor display apparatus may further include a first filter disposed inside the inlet port to remove dust from air introduced through the inlet port and a second filter disposed inside the outlet port to remove dust from air discharged through the outlet port.

The foregoing and/or other features and utilities of the present general inventive concept may be achieved by providing an outdoor display apparatus including a housing having an opening formed at a front portion of the housing, a transparent member disposed in the opening of the housing, a display panel module disposed in the housing, having a display panel spaced-apart from the transparent member to define a first gap and to display an image thereon and having a circuit spaced-apart from a rear portion of the housing to define a second gap and to control the image of the display panel, and an air circulation device to distribute a selectively temperature-controlled air into the first gap and the second gap.

The outdoor display apparatus may further include an optical film disposed on a viewing path of the image from the display panel to an outside of the housing through the transparent member to affect light passing between the transparent member and the display panel.

The outdoor display apparatus may further include an optical film disposed on a viewing path of the image from the display panel to an outside of the housing through the transparent member to reduce at least one of transmission and reflection of light between the transparent member and the display panel.

The transparent member may have a first effective area, the optical film may have a second effective area, and the display panel may have a third effective area different from at least one of the first effective area and the second effective area.

The air circulation device may include an air controlling unit to control a characteristic of air to generate the selectively-temperature-controlled air.

The air circulation device may include a heater to heat air to generate the selectively temperature-controlled air according to at least one of a temperature and humidity.

The circuit of the display panel module may be a first heat generating source to be cooled by non-temperature-controlled air of the air circulation device, and the air circulation device may include a second heat generating source to generate the temperature-controlled air to control characteristics of the transparent member, the display panel and the first gap.

The housing may include an inlet port to introduce air into the air circulation device disposed an inside of the housing, and an outlet port to discharge the air passing through the first gap and the second gap.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
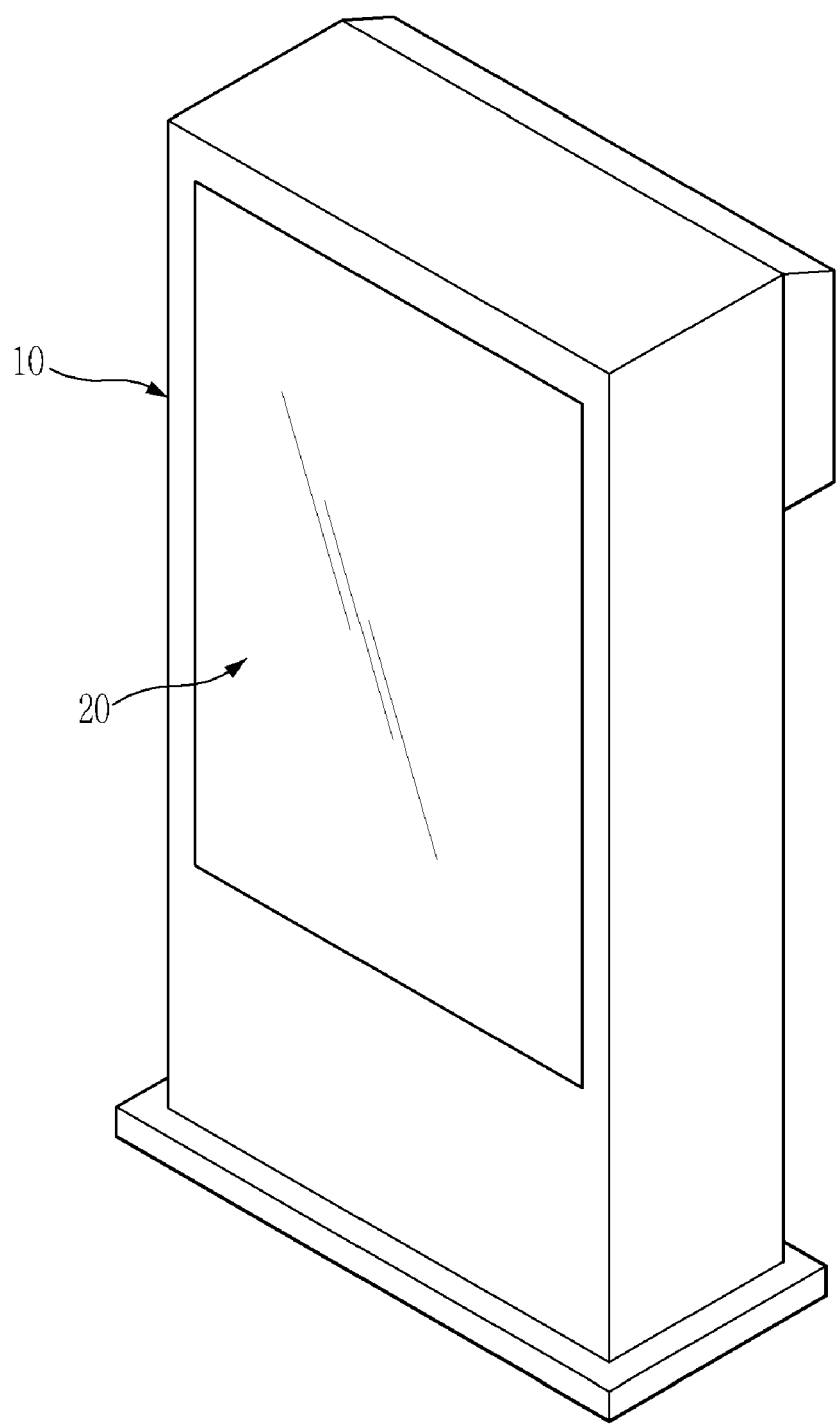
FIG. 1 is a perspective view illustrating an outdoor display apparatus according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Figure 2:
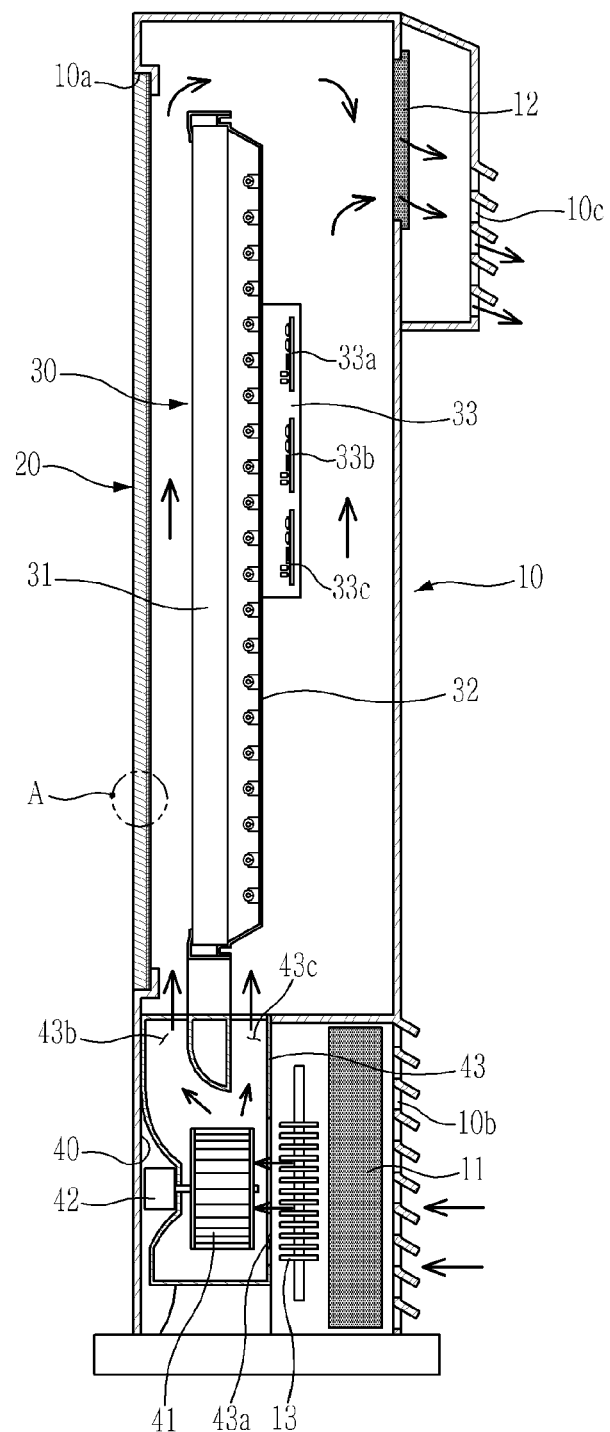
FIG. 2 is a sectional view illustrating an outdoor display apparatus according to an embodiment of the present general inventive concept.

As illustrated in FIGS. 1 and 2, an outdoor display apparatus according to an embodiment of the present general inventive concept includes a housing 10 forming an external appearance of the outdoor display apparatus, the housing 10 having an opening 10a formed at a front portion thereof, a transparent member 20 formed of a transparent material and disposed in the opening 10a, and a display unit, for example, a liquid crystal display panel module 30 disposed in the housing 10 to generate an image. The display unit may be another type of a display panel module to generate or display an image on a screen of a display panel. Although the outdoor display apparatus is illustrated as an embodiment of the present general inventive concept, the outdoor display apparatus may be a display apparatus disposed in an outside environmental area, that is, a non-air controlled area, a low temperature area, a high humid area, and so on.

The housing 10 is formed in a shape of a hexahedral box or a box-like shape. The opening 10a is provided at an upper part of the front portion of the housing 10.

The transparent member 20 is formed of a transparent material to have a high strength, like reinforced glass. The transparent member 20 may be disposed at the upper part of the front portion of the housing 10 so that the transparent member 20 corresponds to the liquid crystal display panel module 30 disposed in the housing 10. An image is generated by and/or displayed on the liquid crystal display panel module 30 and then is viewed from an outside of the housing 10 through the transparent member 20. The housing may have a coupling element 10a to connect the transparent member 20 to the housing 10. The coupling element may be formed at an area to define the opening of the housing 10.

The liquid crystal display panel module 30 may be disposed at an upper part of the housing 10 therewithin. The liquid crystal display panel module 30 may include a liquid crystal display panel 31 to display an image and a backlight unit 32 disposed at a rear portion of the liquid crystal display panel 31 to irradiate light to the liquid crystal display panel 31. A circuit 33 is disposed at the rear portion of the liquid crystal display panel module 30 to control operations of the liquid crystal display panel 31 and the backlight unit 32. The liquid crystal display panel 31 of the liquid crystal display panel module 30 is spaced-apart from the transparent member 20 by a distance to define a gap, through which air flows.

A screen of the liquid crystal display panel 31 of the liquid crystal display panel module 30 may be disposed parallel to a major surface of the transparent member 20. In this case, the distance between the transparent member 20 and the liquid crystal display panel 31 of the liquid crystal display panel module 30 may be constant. However, it is possible that the transparent member 20 can form an angle with a screen of the liquid crystal display panel 31 of the liquid crystal display panel module 30. In this case, the distance between the transparent member 20 and the liquid crystal display panel 31 of the liquid crystal display panel module 30 may not be constant but may be variable according to a distance from a bottom the housing 10 or according to a distance from a side of the housing 10.

A direct type backlight unit, having a light source disposed at the rear of the liquid crystal display panel 31, to directly irradiate light to the liquid crystal display panel 31 or an edge type backlight unit, having a light source disposed at the edge of the liquid crystal display panel 31, to disperse light through a light guide plate and indirectly irradiate light to the liquid crystal display panel 31 may be used as the backlight unit 32. In this embodiment, a direct type backlight unit is used as the backlight unit 32.

The circuit 33 includes a drive unit 33a to drive the liquid crystal display panel 31 and the backlight unit 32, a signal processing unit 33b to receive an external signal and display an image according to the external signal on the liquid crystal display panel 31, and a power supply unit 33c connected to an external power source to convert power received from the external power source and distribute the converted power to the drive unit 33a and the signal processing unit 33b.

It is also possible that the signal processing unit 33*b* may have an image reproducing unit (not illustrated) to generate a signal to correspond to an image to be displayed on the liquid crystal display panel 31. It is also possible that the signal processing unit 33*b* may have a terminal (not illustrated) to be connected to an external device to receive a signal to correspond to the image to be displayed on the liquid crystal display panel 31. The signal processing unit 33*b* may have a controller to process the signal to drive the drive unit and also control the power supply unit 33*c* according to a state of the signal corresponding to the image.

Since the outdoor display apparatus is installed in an outdoor space, the liquid crystal display panel 31 is heated by sunlight reaching the liquid crystal display panel 31 through the transparent panel 20. In this case, the liquid crystal display panel 31 may deteriorate or a performance thereof is lowered. The sunlight or other light may be directly or indirectly reached to the liquid crystal display panel 31 through the transparent panel 20 to affect the performance of the liquid crystal display panel module 30.

In this embodiment, the outdoor display apparatus may include an air circulation device 40 to circulate external air in the housing 10 to maintain an internal temperature of the housing 10 within a predetermined temperature range. To this end, the housing 10 is provided at a lower part of the rear thereof with an inlet port 10*b*, through which air is introduced into the housing 10 and at an upper part of the rear portion thereof with an outlet port 10*c*, through which air having being circulated in the housing 10 is discharged from the housing 10.

Inside the inlet port 10*b* is disposed a first filter 11 to filter a foreign material contained in air introduced through the inlet port 10*b*. Inside the outlet port 10*c* is disposed a second filter 12 to filter out foreign material contained in air discharged through the outlet port 10*c*.

Between the air circulation device 40 and the first filter 11 is disposed a heater 13 to heat air introduced through the inlet port 10*b*, thereby preventing the liquid crystal display panel 31 from being frozen at a low temperature, for example, a temperature in winter. The heater 13 may be selectively, manually, and/or automatically activated to raise the temperature of the inside of the housing 10 according to an environmental condition of a sensor (not illustrated), a manipulation of a switch (not illustrated) formed on the housing, and/or a command to operate the heater 13, respectively.

The air circulation device 40 includes a blowing fan 41 to disposed at the lower part of the housing 10 inside the housing 10 to generate a suction force and a blowing force through a rotation thereof, a drive motor 42 to generate a rotational force to rotate the blowing fan 41, and a guide duct 43, in which the blowing fan 41 is disposed, to guide air suctioned into the blowing fan 41 and air discharged from the blowing fan 41. Accordingly, external air is introduced into the housing 10 through the inlet port 10*b*, is circulated in the housing 10, and is discharged from the housing 10 through the outlet port 10*c*.

In this embodiment, the blowing fan 41 may be a centrifugal fan, for example, to receive air in an axial direction and discharge the received air in a radial direction.

The guide duct 43 includes a suction port 43*a* provided in the axial direction of the blowing fan 41 so that air introduced through the inlet port 10*b* of the housing 10 is suctioned into the blowing fan 41 through the suction port 43*a*, and discharge ports 43*b* and 43*c* disposed outside the blowing fan 41 in the radial direction of the blowing fan 41 so that air discharged from the blowing fan 41 is supplied to the liquid crystal display panel module 30 through the discharge ports 43*b* and 43*c*.

In this embodiment, the air circulation device 40 cools the liquid crystal display panel 31 heated by sunlight and removes heat generated from the circuit 33.

The air circulation device 40 may distribute the air discharged from the blowing fan 41 such that a first portion of the air is supplied to the gap between the liquid crystal display panel 31 and the transparent member 20 and a second portion of the air is supplied to a second gap where the circuit 33 is disposed so as to simultaneously cool the liquid crystal display panel 31 and the circuit 33. The air circulate device 40 may include a divider structure (not illustrated) to define or form the discharge ports 43*b* and 43*c* to direct the air supplied from the blowing fan 41 to one or both of the gap and the second gap.

To this end, the discharge ports 43*b* and 43*c* include a first discharge port 43*b* to discharge the first portion of the air discharged from the blowing fan 41 to the gap between the transparent member 20 and the liquid crystal display panel 31 and a second discharge port 43*c* to discharge the second portion of the air discharged from the blowing fan 41 to the circuit 33. Accordingly, the first portion of the air discharged from the blowing fan 41 passes through the gap between the transparent member 20 and the liquid crystal display panel 31 through the first discharge port 43*b* to cool the liquid crystal display panel 31 and is discharged through the outlet port 10*c*, thereby preventing deterioration of the liquid crystal display panel 31, and the second portion of the air discharged from the blowing fan 41 is supplied to the second gap corresponding to the circuit 33 through the second discharge port 43*c* to cool the circuit 33 and is discharged through the outlet port 10*c*, thereby preventing overheating of the circuit 33. That is, the liquid crystal display panel 31 and the circuit 33 may be simultaneously cooled by the air circulation device 40.

In the outdoor display apparatus, deterioration of the liquid crystal display panel 31 via interaction with sunlight is prevented. In this embodiment, the first portion may be, for example, 70% of the air discharged from the blowing fan 41 to be supplied to the gap between the transparent member 20 and the liquid crystal display panel 31 through the first discharge port 43*b*, and the second portion may be, for example, 30% of the air discharged from the blowing fan 41 to be supplied to the second gap corresponding to the rear portion of the liquid crystal display panel 31, i.e., the backlight unit 32 and the circuit 33, through the second discharge port 43*c*.

In this embodiment, the first discharge port 43*b* and the second discharge port 43*c* are designed so that 70% of the air discharged from the blowing fan 41 is supplied to the gap between the transparent member 20 and the liquid crystal display panel 31 through the first discharge port 43*b* and 30% of the air discharged from the blowing fan 41 is supplied to the circuit 33 through the second discharge port 43*c*. When sufficient air is not supplied to the gap between the transparent member 20 and the liquid crystal display panel 31 due to flow resistance, an auxiliary blowing fan (not illustrated) may be disposed in the first discharge port 43*b*.

The outdoor display apparatus may have a sensor (not illustrated) to detect at least one of an inside temperature and an outside temperature and a controller (not illustrated) to control the heater 13 and/or the air circulation device 40. The sensor (not illustrated) may be disposed on the housing 10 or an inside of the housing 10. The controller (not illustrated)

may be disposed in the air circulation device 40 or may be embodied in the circuit 33 of the liquid crystal display panel module 30 such that the circuit 33 of the liquid crystal display panel 31 can control the liquid crystal display panel 31 and the air circulation device 40. The controller (not illustrated) may control the heater 13 according to the detected temperature. It is possible that the controller may control the heater 13 according to a command included in the signal received at the circuit 33 from an external device.

The outdoor display apparatus may perform a heating mode to operate the heater 13 and an air circulating mode to operate the motor 42 and the blowing fan 41. The air circulating mode may not include the heating mode.

It is possible that the outdoor display apparatus may include a sensor (not illustrated) to detect a humidity at an inside of the housing 10 and/or an outside of the housing 10 such that the heating mode and/or the air circulating mode can be performed according to the detected humidity and/or the detected temperature. When humidity is high, vapor condensation may be formed on the transparent member 20 or the liquid crystal display panel module 30. In this case, the water or vapor condensation may be removed from the transparent member 20 and/or the liquid crystal display panel module 30 or from the gap and/or the second gap by selectively performing the heating mode and/or the air circulating mode.

When sunlight is reached the liquid crystal display panel 31 through the transparent member 20, is reflected by the liquid crystal display panel 31, and/or is transmitted back to the outside thereof, contrast of an image displayed on the liquid crystal display panel 31 may be lowered.

Figure 3:
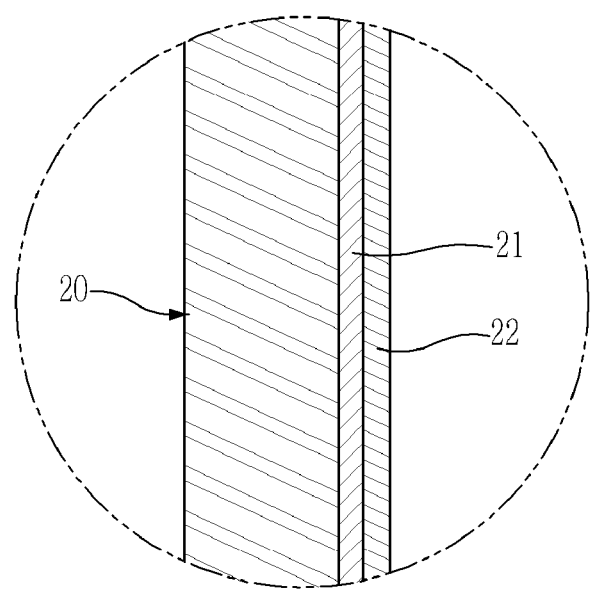
FIG. 3 is an enlarged view of a portion A of FIG. 2 to illustrate an example of a transparent member of an outdoor display apparatus according to an embodiment of the present general inventive concept.

In this embodiment, as illustrated in FIG. 3, an optical film is disposed between the transparent 20 and the liquid crystal display panel 31 to prevent contrast of the image displayed on the liquid crystal display panel 31 from being lowered. The optical film may include a polarizing film 21 having the same optical axis as the image displayed on the liquid crystal display panel 31 and a ¼ wavelength plate 22 to convert the optical axis of the image displayed on the liquid crystal display panel 31 into circular polarized light. It is possible that the optical film may change a first characteristic of the light into a second characteristic.

The polarizing film 21 and the ¼ wavelength plate 22 are sequentially disposed in an advancing direction of the light. In this embodiment, the polarizing film 21 and the ¼ wavelength plate 22 are sequentially disposed on or inside the transparent member 20. That is, the polarizing film 21 is disposed inside the transparent member 20, and the ¼ wavelength plate 22 is disposed inside the polarizing film 21. Also, the polarizing film 21 and the ¼ wavelength plate 22 have a surface area equal to or greater than that of an effective display area of the liquid crystal display panel 31 and equal to or less than that of the transparent member 20 to efficiently block transmission and/or reflection of light in the effective display area of the liquid crystal display panel 31.

The polarizing film 21 transmits only a specific optical axis component of the polarized light and absorbs the remainder of the polarized light. The ¼ wavelength plate 22 may have an optical axis with an inclination of 45 degrees to the optical axis of the polarizing film 21.

The polarizing film 21 and the ¼ wavelength plate 22 are operated as follows. In the following description, it is assumed that the optical axis of the polarizing film 21 is a Y axis, and the optical axis perpendicular to the optical axis of the polarizing film 21 is an X axis for convenience of description.

When sunlight is incident upon the transparent member 20 of the outdoor display apparatus, a portion of the sunlight is reflected by the transparent member 20, and the remaining portion of the sunlight is transmitted through the transparent member 20 and is incident upon the polarizing film 21. The polarizing film 21 transmits only Y-axis polarized light corresponding to the optical axis of the polarizing film 21, i.e., the Y axis, and absorbs the remainder of the polarized light. The polarized light, having passed through the polarizing film 21, is incident upon a front portion of the ¼ wavelength plate 22 and is converted into circular polarized light while passing through the ¼ wavelength plate 22.

The circular polarized light, having passed through the ¼ wavelength plate 22, is reflected by the liquid crystal display panel 31 and is incident upon the rear of the ¼ wavelength plate 22. While passing through the ¼ wavelength plate 22, the reflected light is converted into X-axis polarized light perpendicular to the optical axis of the polarizing film 21, i.e., the Y axis. The X-axis polarized light is incident upon the polarizing film 21. Since the optical axis of the polarizing film 21 is the Y axis, the X-axis polarized light is not transmitted. The X-axis polarized light may be absorbed by the polarizing film 21. Although sunlight passes through the transparent member 20 and reaches the liquid crystal display panel 31, light reflected by the liquid crystal display panel 31 is absorbed by the polarizing film 21, thereby preventing the light from being transmitted to the outside thereof.

Consequently, contrast of an image displayed on the liquid crystal display panel 31 is prevented from being lowered by sunlight, thereby improving visibility of an image displayed on the liquid crystal display panel 31.

Although FIG. 3 illustrates only the polarizing film 21 and the ¼ wavelength plate 22 are provided, the present general inventive concept is not limited thereto. In addition to the polarizing film 21 and the ¼ wavelength plate 22, a functional film may be attached to the front and/or rear portions of the transparent member 20 or the front portion of the liquid crystal display panel 31 to improve visibility of an image displayed on the liquid crystal display panel 31. The functional film may include an anti-static film to restrain generation of static electricity, preventing dust from sticking to the front of the transparent member 20 or the liquid crystal display panel 31 and an anti-reflection film disposed at the transparent member 20 or the liquid crystal display panel 31 to reduce reflection of light.

In this embodiment, the polarizing film 21 and the ¼ wavelength plate 22 are disposed inside the transparent member 20, to which, however, embodiments of the present general inventive concept are not limited. When the polarizing film 21 and the ¼ wavelength plate 22 may be disposed at the front portion of the liquid crystal display panel 31 or when the polarizing film 21 and the ¼ wavelength plate 22 may be disposed in the gap between transparent member 20 and the liquid crystal display panel 31, the polarizing film 21 and the ¼ wavelength plate 22 may be spaced apart from the transparent member 20 and the liquid crystal display panel 31 to improve the visibility and other factors of the image.

The transparent member 20 may have a first area, the optical film may have a second area, and the liquid crystal display panel 31 may have a third area to display an image. The image displayed in the third area of the liquid crystal display panel 31 may be transmitted to an outside of the housing 10 through the second area of the optical film and the first area of the transparent member 20. Although the liquid crystal display panel 31 is spaced apart from the transparent member 20, the image of the liquid crystal display panel 31 can be displayed to a viewer at a predetermined viewing angle since the first area is larger than the third area.

The sunlight may be transmitted through the first area of the transparent member 20, the second area of the optical film, and the third area of the liquid crystal display panel 31. Since the liquid crystal display panel 31 is spaced apart from the transparent member 20, all of the sunlight incident on the first area of the transparent member 20 may not be transmitted to the optical film and/or the liquid crystal display panel 31 depending on an incident angle.

As is apparent from the above description, air flows via the gap between the liquid crystal display panel and the transparent member and to the circuit to prevent the liquid crystal display panel from deteriorating by sunlight and to prevent the circuit from being overheated by sunlight or by an operation thereof, and the optical film is disposed between the transparent member and the liquid crystal display panel to prevent contrast of an image displayed on the liquid crystal display panel from being lowered by sunlight, thereby improving visibility of the image displayed on the liquid crystal display panel.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An outdoor display apparatus comprising:
   a housing having an opening formed at a front portion thereof, an inlet port through which air is introduced, and an outlet port through which air is discharged;
   a transparent member disposed in the opening;
   a liquid crystal display panel module disposed in the housing, spaced apart from the transparent member to define a gap therebetween, and provided with a liquid crystal display panel at a front side thereof to display an image;
   a circuit disposed at a rear portion of the liquid crystal display panel module;
   a filter coupleable to an inside of the inlet port to remove dust from air introduced through the inlet port;
   a temperature controlling unit configured to control a temperature inside the housing and disposed between the filter and the gap, and
   an optical film disposed inside the transparent member, the optical film extends parallel to the liquid crystal display panel of the liquid crystal display panel module, the optical film being disposed on an inner surface of the transparent member, and the optical film including:
      a polarizing film having an optical axis the same as an optical axis of light passing through the liquid crystal display panel, and
      a ¼ wavelength plate to convert an optical axis of the image displayed on the liquid crystal display panel into circular polarized light having an optical axis perpendicular to the optical axis of the polarizing film that is the same as the optical axis of the liquid crystal display panel,
   wherein the liquid crystal display panel is configured to reflect the circular polarized light that has passed through the ¼ wavelength plate of the optical film, and the ¼ wavelength plate is a single ¼ wavelength plate of the outdoor display apparatus which converts the optical axis of the image in the outdoor display apparatus.

2. The outdoor display apparatus of claim 1, wherein the polarizing film has a surface area greater than that of an effective display area of the liquid crystal display panel and equal to that of the transparent member.

3. The outdoor display apparatus of claim 1, wherein the polarizing film and the ¼ wavelength plate have a surface area greater than that of an effective display area of the liquid crystal display panel and equal to that of the transparent member.

4. The outdoor display apparatus according to claim 1, wherein the liquid crystal display panel module further comprises a backlight unit disposed to irradiate light to the liquid crystal display panel, and
   the circuit comprises a drive unit to drive the liquid crystal display panel and the backlight unit, a signal processing unit to receive an external signal on the liquid crystal display panel and to control the liquid crystal display panel to display an image corresponding to the external signal, and a power supply unit to convert and distribute external power to the drive unit and the signal processing unit.

5. The outdoor display apparatus according to claim 1, further comprising:
   an outlet filter coupleable to an inside of the outlet port to remove dust from air discharged through the outlet port.

6. The outdoor display apparatus of claim 1, wherein the temperature controlling unit includes a fan to draw air through the inlet port.

7. The outdoor display apparatus of claim 6, wherein the temperature controlling unit further includes a heater to raise the temperature inside the housing, the heater being disposed between the filter and the fan.

8. The outdoor display apparatus of claim 6, further comprising an air circulation device to distribute air introduced through the inlet port.

9. The outdoor display apparatus of claim 8, the air circulation device comprising:
   a dividing structure,
   wherein the dividing structure is configured such that a first portion of the air passes through the gap between the transparent member and the liquid crystal display panel and a second portion of the air simultaneously passes through the circuit, the first portion and the second portion of the air being discharged through the outlet port.

10. The outdoor display apparatus of claim 9, wherein the air circulation device further comprises a guide duct, in which a fan is disposed.

11. The outdoor display apparatus of claim 10, wherein the guide duct includes a first discharge port to guide the first portion of air discharged from the fan to the gap between the transparent member and the liquid crystal display panel, and a second discharge port to guide the second portion of the air discharged from the fan to the circuit.

12. The outdoor display apparatus according to claim 8, wherein the air circulation device is disposed at a lower part of the housing, the inlet port is provided at the lower part of the housing, and the outlet port is provided at an upper part of the housing.

13. The outdoor display apparatus according to claim 8, wherein the air circulation device comprises:
   a guide duct, in which the fan is disposed, having a first discharge port to guide the first portion of air discharged from the fan to the gap between the transparent member and the liquid crystal display panel.

14. The outdoor display apparatus according to claim 13, wherein the guide duct comprises a second discharge port to guide the second portion of the air discharged from the fan to the circuit.

15. The outdoor display apparatus according to claim 14, wherein the first portion of the air guided by the first discharge port is about 70% of the air discharged from the fan, and the second portion of the air guided by the second discharge port is about 30% of the air discharged from the fan.

16. An outdoor display apparatus comprising:
a housing having an opening formed at a front portion of the housing;
a transparent member disposed in the opening of the housing;
a display panel module disposed in the housing, having a display panel spaced apart from the transparent member to define a first gap and to display an image thereon and having a circuit disposed in a rear portion of the housing to define a second gap;
an inlet port to introduce air into the housing;
an outlet port to discharge the air passing through the first gap and the second gap of the housing;
a filter coupleable to an inside of the inlet port to remove dust from air introduced through the inlet port;
a temperature controlling unit configured to control a temperature of an inside of the housing and disposed between the filter and the first gap and the second gap, and
an optical film disposed on a viewing path of the image, wherein the optical film extends parallel to the display panel to an outside of the housing to control light passing between the transparent member and the display panel, the optical film including:
a polarizing film having an optical axis the same as an optical axis of light passing through the display panel, and
a ¼ wavelength plate to convert an optical axis of the image displayed on the display panel into circular polarized light having an optical axis perpendicular to the optical axis of the polarizing film that is the same as the optical axis of the liquid crystal display panel, and wherein the liquid crystal display panel is configured to reflect the circular polarized light that has passed through the ¼ wavelength plate, and the ¼ wavelength plate is a single ¼ wavelength plate of the outdoor display apparatus which converts the optical axis of the image in the outdoor display apparatus.

17. The outdoor display apparatus of claim 16, wherein the optical film reduces at least one of transmission of light transmitted through the transparent member and the light being reflected off of the display panel.

18. The outdoor display apparatus of claim 16, wherein the temperature controlling unit includes a fan to draw air through the inlet port and a drive motor to rotate the fan.

19. The outdoor display apparatus of claim 18, wherein the temperature controlling unit further includes a heater to heat the air, the heater being selectively activated to raise a temperature inside of the housing based on a sensor that is disposed on and/or inside the housing,
wherein the circuit of the display panel module is a first heat generating source to be cooled by non-temperature-controlled air of the air circulation device.

20. The outdoor display apparatus of claim 18, further comprising an air circulation device to distribute a selectively temperature-controlled air into the first gap and the second gap.

21. The outdoor display apparatus of claim 20, the air circulation device comprising:
a dividing structure disposed between the fan and the display panel module to divide the air so that a first portion of the air passes into the first gap and a second portion of air simultaneously passes through the second gap.

22. The outdoor display apparatus of claim 21, wherein the air circulation device further comprises a guide duct, in which the fan is disposed.

23. The outdoor display apparatus of claim 22, wherein the guide duct includes a first discharge port to guide the first portion of air discharged from the fan to the first gap between the transparent member and the display panel, and a second discharge port to guide the second portion of the air discharged from the fan to the circuit.

* * * * *